United States Patent
Chang et al.

(10) Patent No.: US 9,754,943 B1
(45) Date of Patent: Sep. 5, 2017

(54) DYNAMIC RANDOM ACCESS MEMORY DEVICE

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Kai-Jiun Chang, Taoyuan (TW); Yi-Wei Chen, Taichung (TW); Tsun-Min Cheng, Changhua County (TW); Chih-Chieh Tsai, Kaohsiung (TW); Wei-Hsin Liu, Changhua County (TW); Jui-Min Lee, Taichung (TW); Chia-Lung Chang, Tainan (TW)

(73) Assignees: UNITED MICROELECTRONICS CORP., Hsin-Chu (TW); Fujian Jinhua Integrated Circuit Co., Ltd., Quanzhou, Fujian province (CN)

( * ) Notice: Subject to any disclaimer, the term of this patent is extended or adjusted under 35 U.S.C. 154(b) by 0 days.

(21) Appl. No.: 15/272,425

(22) Filed: Sep. 21, 2016

(51) Int. Cl.
| | |
|---|---|
| *H01L 21/336* | (2006.01) |
| *H01L 21/8242* | (2006.01) |
| *H01L 27/108* | (2006.01) |
| *H01L 23/528* | (2006.01) |
| *H01L 23/532* | (2006.01) |
| *H01L 29/06* | (2006.01) |

(52) U.S. Cl.
CPC ...... *H01L 27/10808* (2013.01); *H01L 23/528* (2013.01); *H01L 23/53271* (2013.01); *H01L 23/53295* (2013.01); *H01L 27/10823* (2013.01); *H01L 29/0649* (2013.01)

(58) Field of Classification Search
None
See application file for complete search history.

(56) References Cited

U.S. PATENT DOCUMENTS

| | | | |
|---|---|---|---|
| 6,420,189 B1 | 7/2002 | Lopatin | |
| 7,205,192 B2 | 4/2007 | Kweon | |
| 7,915,121 B1 | 3/2011 | Kim | |
| 8,785,998 B2 | 7/2014 | Chung et al. | |
| 8,871,559 B2 | 10/2014 | Horii et al. | |
| 2006/0110865 A1* | 5/2006 | Liu | H01L 21/265 438/151 |
| 2010/0240180 A1* | 9/2010 | Jeon | H01L 21/82343 438/239 |

\* cited by examiner

*Primary Examiner* — Khaja Ahmad
(74) *Attorney, Agent, or Firm* — Winston Hsu

(57) ABSTRACT

A dynamic random access memory (DRAM) device includes a substrate, plural word lines and plural bit lines. The word lines are disposed in the substrate along a first trench extending along a first direction. Each of the word lines includes a multi-composition barrier layer, wherein the multi-composition barrier layer includes $TiSi_xN_y$ with x and y being greater than 0 and the multi-composition barrier layer is silicon-rich at a bottom portion thereof and is nitrogen-rich at a top portion thereof. The bit lines are disposed over the word lines and extended along a second direction across the first direction.

15 Claims, 5 Drawing Sheets

DYNAMIC RANDOM ACCESS MEMORY DEVICE

BACKGROUND OF THE INVENTION

1. Field of the Invention

The present invention generally relates to the field of memory devices, and more particularly to a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

One object of the present invention is to provide a DRAM device, and the word lines disposed therein have a multi-composition barrier layer. The multi-composition barrier layer is nitrogen-rich at the top portion and is silicon-rich at the bottom portion, so that, the resistances between the multi-composition barrier layer and the stacked layers below and/or above the multi-composition barrier layer are sufficiently reduced.

To achieve the purpose described above, the present invention provides a DRAM device including a substrate, a plurality of word lines and a plurality of bit lines. The word lines are disposed in a substrate along a first trench extending along a first direction, and each of the word lines includes a multi-composition barrier layer. The multi-composition barrier layer includes $TiSi_xN_y$ with x and y being greater than 0, and the multi-composition barrier layer is silicon-rich at a bottom portion thereof and is nitrogen-rich at a top portion thereof. The bit lines are disposed over the word lines and extend along a second direction across the first direction.

The DRAM device in the present invention is characterized by disposing a multi-composition barrier layer between the work function layer and the conductive layer in each word line, and the multi-composition barrier layer includes $TiSi_xN_y$ with x and y being greater than 0. The bottom portion of the multi-composition barrier layer is silicon-rich, that is, the bottom portion may serve as an ohmic contact layer thereto reduce the resistance of the barrier layer. Otherwise, the top portion of the multi-composition barrier layer is nitrogen-rich, that is, the top portion may obtain bigger crystal grain thereto reduce the grain boundary between the barrier layer and the metal conductive layer. In this way, the device performance and reliability of the DRAM device of the present invention may be sufficiently improved thereby.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
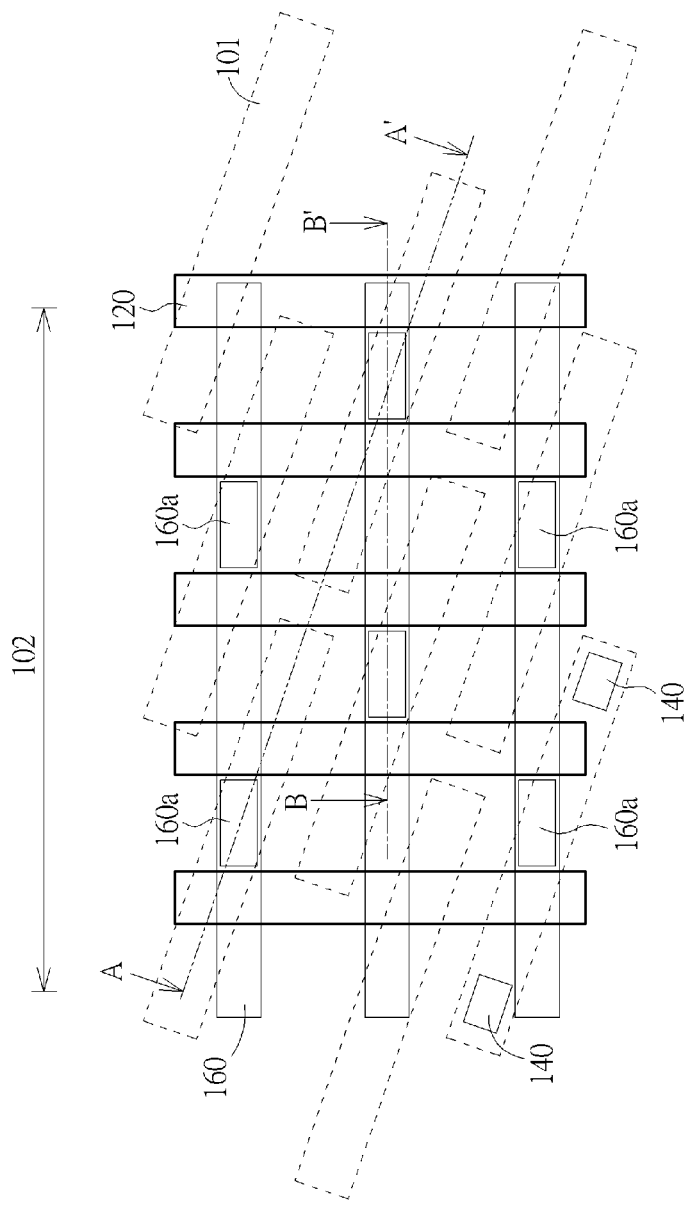
FIG. 1 is a schematic diagram illustrating a top view of a DRAM device according to a preferred embodiment of the present invention.
Figure 2:
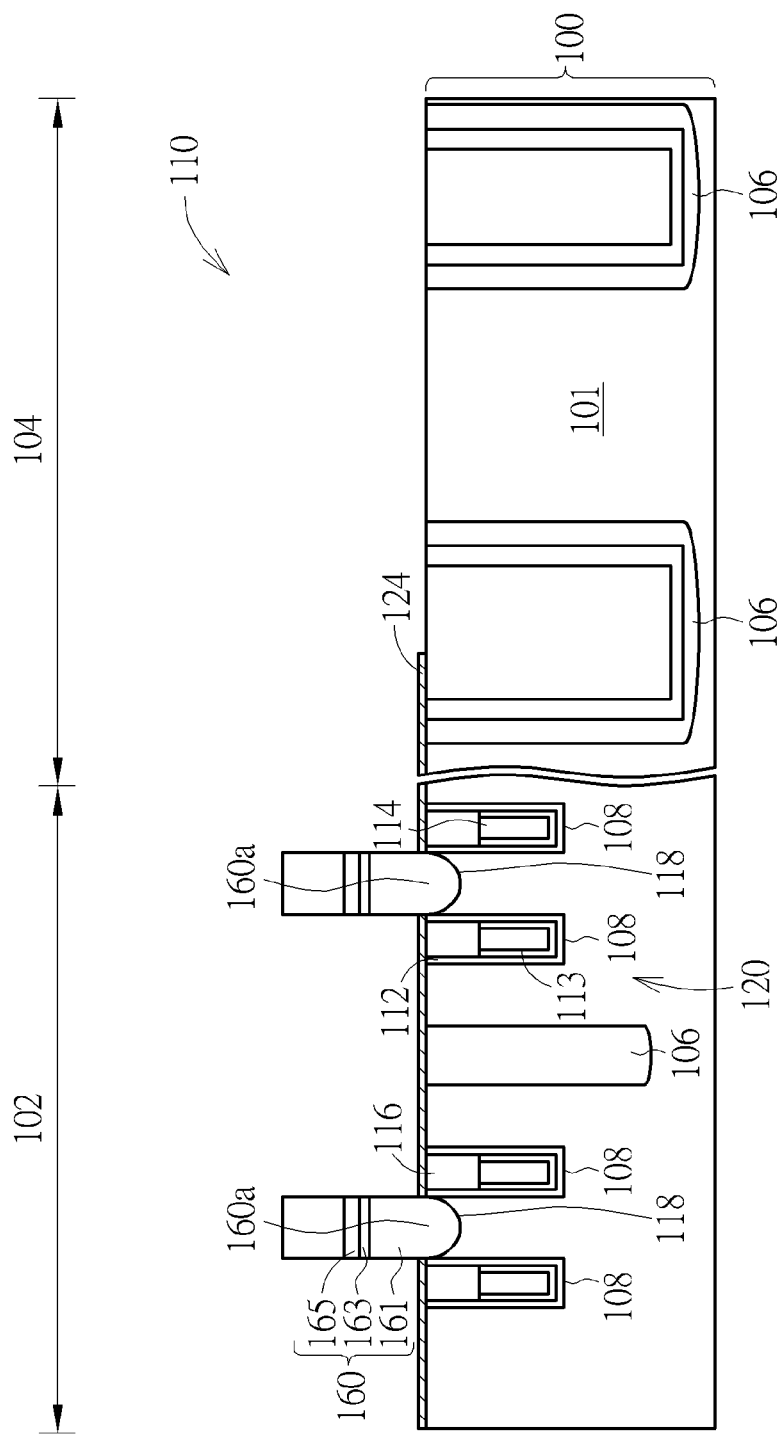
FIG. 2 is a schematic diagram illustrating a cross-sectional view taken along a line A-A' in FIG. 1.
Figure 3:
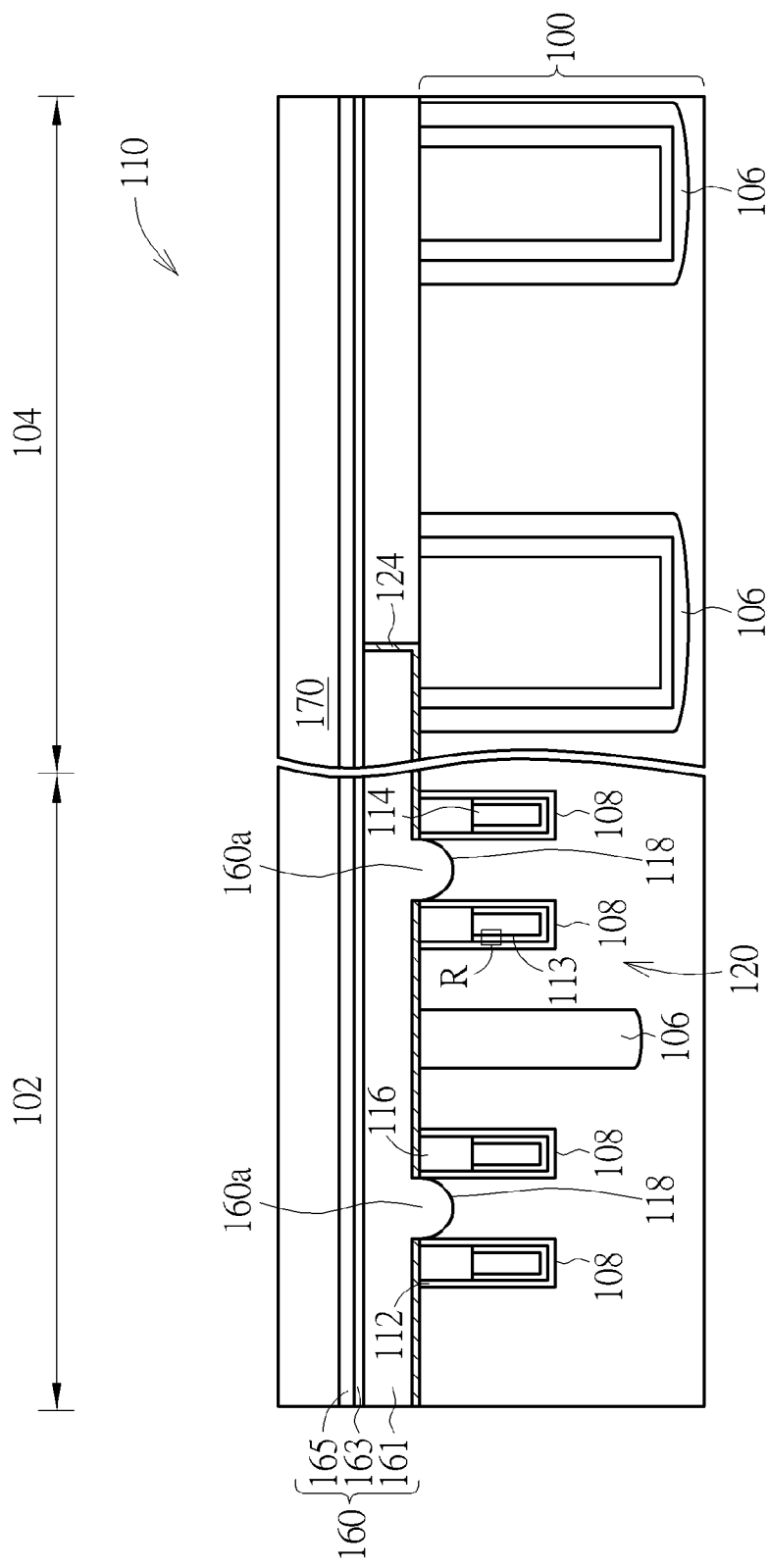
FIG. 3 is a schematic diagram illustrating a cross-sectional view taken along a line B-B' in FIG. 1.

Referring to FIGS. 1-3, FIGS. 1-3 illustrate a dynamic random access memory (DRAM) device according to a preferred embodiment of the present invention, in which FIG. 1 is a schematic top view of the DRAM device and FIGS. 2 and 3 are cross-sectional views taken along the line A-A' and the line B-B' respectively. In the present embodiment, a memory cell such as a DRAM device 110 with a buried gate is provided, the DRAM device 110 includes at least one transistor (not shown in the drawings) and at least one capacitor structure (not shown in the drawings), thereto serve as the smallest unit in the DRAM array for accepting signals from word lines 120 and bit lines 160 during the operation.

The DRAM device 110 includes a substrate 100, and at least one shallow trench isolation (STI) 106 is formed in the substrate 100 to define a plurality of active areas (AA) 101 on the substrate 100, as shown in FIG. 1. Also, a memory region 102 and a periphery region 104 are further defined on the substrate 100, wherein a plurality of word lines (WL) 120 and a plurality of bit lines (BL) 160 in the DRAM device 110 are both formed in the memory region 102 as shown in FIG. 2, and other active elements (not shown in the drawings) may further be formed in the periphery region 104. It is noted that, FIG. 1 only illustrates the top view of the memory region 102 in the DRAM device 110 and the elements formed in the periphery region 104 in the DRAM device 110 have been omitted in FIG. 1.

In the present embodiment, each of the active areas 101 are formed in parallel with one another along a first direction, and the word lines 120 are formed in the substrate 100, across on each active area 101. Precisely speaking, each of the word lines 120 are formed along a trench 108 in the substrate 100, and the trench 108 is formed along a second direction which is across the first direction for example. In one embodiment, the formation of the word line 120 may include firstly forming a dielectric layer 112 such as a silicon oxide layer or a high-k dielectric layer covered on surfaces of the trench 108 to serve as a gate dielectric layer, sequentially forming a work function layer (not shown in the drawings), a barrier layer 113 and agate 114 stacked one over another in the trench 108, and then forming an insulating layer 116 on the gate 114. Through the aforementioned forming steps, the insulating layer 116 is leveled with the top surface of the substrate 100, and the gate 114, the barrier layer 113, the work function layer and the dielectric layer 112 stacked one over another may together form a buried word line (BWL) as shown in FIGS. 2 and 3. Additionally, a storage node contact (SNC) 140 is further disposed on the active area 101 at two sides of the word lines 120, and the storage node contact 140 may be used to electrically connect to a source/drain region (not shown in the drawings) of the transistor. In one embodiment, the storage node contact 140 is for example formed in an insulating layer (not shown in the drawings) on the active area 101. The formation of the storage node contact 140 may include first forming a trench in the insulating layer, forming a barrier layer (not shown in the drawings) such as a titanium (Ti)/titanium nitride (TiN) layer in the trench and then forming a metal conductive layer to fill up the trench, wherein the metal conductive layer may include a low resistant metal like tungsten (W), aluminum (Al) or copper (Cu).

It is noted that, the barrier layer 113 includes a multi-composition structure with $TiSi_xN_y$, and the gate 114 includes low-resistant metals such as W, Al or Cu, but is not limited thereto. The barrier layer 113 may include a plurality of first metal oxide layers and a plurality of second metal oxide layers stacked alternately on one over another with at least plural first metal oxide layers directly in contact with each other or with at least plural second metal oxide layers directly in contact with each other. The first metal oxide layers and the second metal oxide layers are formed through an atomic layer deposition (ALD) process by sequentially importing different precursors during the ALD process. For example, precursors of dichlorosilane ($SiH_2Cl_2$) and ammonia ($NH_3$) may be imported to form the first metal oxide layer such as a silicon nitride (SiN) layer 113a, and precursors of titanium tetrachloride ($TiCl_4$) and ammonia may be imported to form the second metal oxide layer such as a TiN layer 113b.

Figure 4:
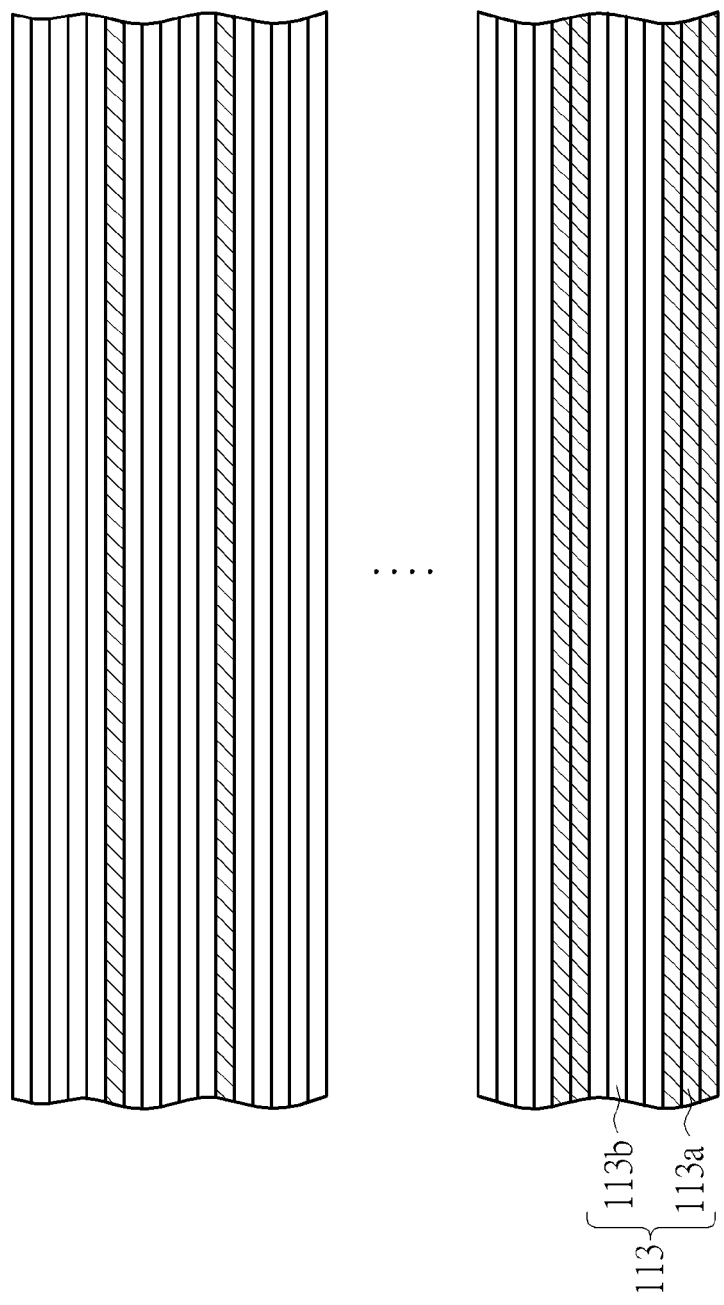
FIG. 4 is a schematic diagram illustrating an enlarged view of a portion R in FIG. 3.

Please also note that, although the barrier layer 113 of the present embodiment is mainly formed by performing the TiN layer 113b cycles that import the precursors of $TiCl_4$ and $NH_3$, some SiN layer 113a cycles that import the precursors of $SiH_2Cl_2$ and $NH_3$ are also performed between the TiN layer 113b cycles. Also, in the early stage of the deposition, a ratio between the quantities of the stacked TiN layers 113b and the stacked SiN layers 113a is about 2:1 to 4:3, as shown in FIG. 4. However, in another embodiment, the ratio between the quantities of the stacked TiN layers 113b and the stacked SiN layers 113a in the early stage of the deposition may also reach to 0.5-1:20, but is not limited thereto. Then, the TiN layer 113b cycles are gradually increased during the deposition process of the barrier layer 113. Thus, in the late stage of the deposition, a ratio between the quantities of the stacked TiN layers 113b and the stacked SiN layers 113a is about 5:1 to 10:1, as shown in FIG. 4. Otherwise, in another embodiment, the ratio between the quantities of the stacked TiN layers 113b and the stacked SiN layers 113a in the late stage of the deposition may reach to 10-20:0.5-1, but is not limited thereto. In other words, the barrier layer 113 of the present embodiment includes the multi-composition structure of $TiSi_xN_y$, where in the early stage of the formation process thereof, a bottom portion (namely the portion closed to the work function layer) of the barrier layer 113 is formed to be silicon-rich, and a ratio of x:y in the bottom portion is about 10-20:0.1. In contrast, in the late stage of the formation process thereof, a top portion (namely the portion closed to the gate 114) of the barrier layer 113 is formed to be nitrogen-rich, and a ratio of x:y in the top portion is about 0.1:10-20, but is not limited thereto.

In another embodiment, a single barrier layer with continuously and gradually increased or decreased silicon or nitrogen may also be formed. The barrier layer also includes $TiSi_xN_y$, with x and y being greater than 0, and the ratio of x:y is varied by each portion of the barrier layer. Preferably, the ratio of x:y is varied from 20:0.1 to 0.1:20 from the bottom to the top, but is not limited thereto. Precisely speaking, the barrier layer may include a single film, wherein the bottom portion of the single film, the ratio of x:y is about 10-20:0.1, and the ratio of x may decrease while moving to the upper portion and the ratio of y may increase while moving to the upper portion. That is, in the top portion of the single film, the ratio of x:y is about 0.1:10-20. Furthermore, in another embodiment of the present invention, a bottom barrier may be further formed between the dielectric layer 112 and the work function layer, the bottom barrier layer may include a multi-composition barrier layer with $TiSi_xN_y$, and the structural and material features thereof are all the same as those of the barrier layer 113, and will not be redundantly described herein.

People in the art should easily realize that although the formation of the barrier layer 113 shown in FIG. 4 is exemplified by first performing three times of the SiN layer 113a cycles followed by performing four times of the TiN layer 113b cycles, two times of the SiN layer 113a cycles and four times of the TiN layer 113b cycles, the forming process of the barrier layer 113 in the present invention is not limited to be formed through first performing the SiN layer 113a cycle or the TiN layer 113b cycle. In other embodiments, the barrier layer may also be formed through first performing the TiN layer 113b cycle followed by performing the SiN layer 113a cycle, wherein the quantities of the TiN layers 113b and the SiN layers 113a in the bottom portion of the barrier layer may still be about 4:3 to 2:1, and the quantities of the TiN layers 113b and the SiN layers 113a in the top portion of the barrier layer may still be about 10-20:0.1-1.

On the other hand, the bit lines 160 are formed in parallel with one another on the substrate 100 along a third direction and also across each active area 101, and the third direction is different from the first direction and the second direction. In one preferred embodiment, the third direction is preferably perpendicular to the second direction. That is, the first direction, the second direction and the third direction are all different from each other and the first direction is not perpendicular to either the second direction or the third direction, as shown in FIG. 1. The bit lines 160 and the word lines 120 are isolated from each other through an insulating layer 124 disposed on the substrate 100, and the bit lines 160 are electrically connected to a source/drain region (not shown in the drawings) of the transistor via at least one bit line contact (BLC) 160a. The bit line contact 160a may be formed below the bit lines 160 between two word lines 120. Moreover, the bit line contact 160a includes a conductive layer such as a semiconductor layer like a polysilicon layer 161 shown in FIG. 2.

The bit line 160 is formed by the polysilicon layer 161, the barrier layer 163 and the metal conductive layer 165 stacked on one over another on the substrate 100. The barrier layer 163 includes tantalum (Ta), tantalum nitride (TaN), titanium tungsten (TiW) or tungsten nitride (WN), and the metal conductive layer 165 includes a low resistant metal such as W, Al or Cu, but is not limited thereto. In one embodiment, the formation of the bit line contacts 160a include firstly forming a plurality of trenches 118 in the substrate 100, and forming the polysilicon layer 161 to fill up the trenches 118 and to further cover on the insulating layer 124, as shown in FIGS. 2 and 3. Following these, the barrier layer 163, the metal conductive layer 165 and a mask layer 170 are formed on the polysilicon layer 161, and the mask layer 170 and the metal conductive layer 165, the barrier layer 163 and the polysilicon layer 161 underneath are then patterned to form the bit lines 160 and the bit line contacts 161a under the bit line 160 simultaneously. In other words, the bit lines 160 and the bit line contacts 160a are monolithic and are formed through the same polysilicon layer 161.

Overall, the DRAM device in the preferred embodiment of the present invention further disposes a multi-composition barrier layer between the work function layer and the gate in the word lines, and the multi-composition barrier layer includes TiSi$_x$N$_y$ with x and y being greater than 0. The bottom portion (namely, the portion closed to the work function layer underneath) of the multi-composition barrier layer is formed from a higher ratio of the stacked SiN layers, so as to be silicon-rich accordingly. The ratio of x:y is about 10-20:0.1-1 in the bottom portion, that is, the bottom portion may serve as an ohmic contact layer thereto reduce the resistance between the barrier layer and the stacked layer underneath. Otherwise, the top portion (namely, the portion closed to the gate) of the multi-composition barrier layer is formed from a higher ratio of the stacked TiN layers, so as to be nitrogen-rich accordingly. The ratio of x:y is about 0.1-1: 10-20 in the top portion, that is, the top portion may obtain bigger crystal grain thereto reduce the grain boundary between the barrier layer and the metal conductive layer (namely the gate) above. In this way, the resistance of the barrier layer itself may be sufficiently reduced. Furthermore, since the multi-composition barrier layer of the present invention consists of single material and is formed only through the ALD process, the additional stacked layers with different material have been omitted. That is, the height of the word line is able to be reduced accordingly, and the fabrication of the barrier layer in the present invention may be easily achieved through a simplified and convenient process.

Moreover, people skilled in the arts should be easy to realize that although the barrier layers in the aforementioned embodiments are exemplified by being used in a buried word line of a DRAM device, the practical development of the present invention is not limited thereto. In other embodiments, the barrier layer may also be used in any type of plug structure, such as a contact plug (not shown in the drawings) which is electrically connected to a source/drain region or a via plug (not shown in the drawings) which is electrically connected to a metal wire. For example, in the embodiment of DRAM device 110 above, the barrier layer may also be used in the storage node contact 140 which is electrically connected the capacitor structure to the transistor, as shown in FIG. 1, for reducing the contact resistance between the storage node contact 140 and the substrate 100 underneath.

Figure 5:
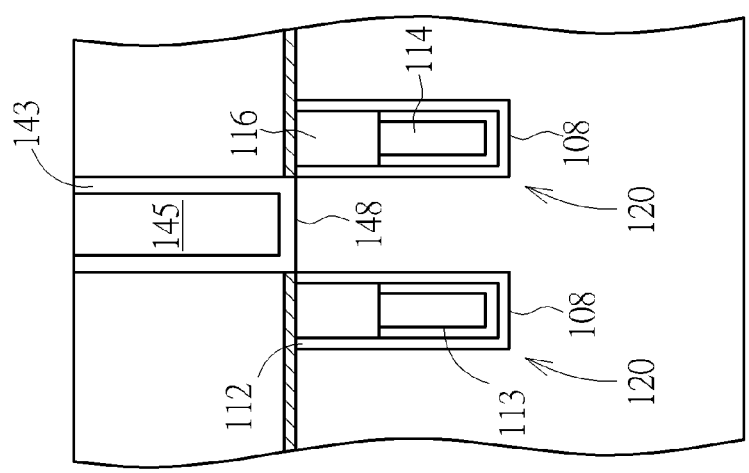
FIG. 5 is a schematic diagram illustrating a cross-sectional view of a storage node contact in FIG. 1.

In one embodiment shown in FIG. 5, the storage node contact 140 includes a barrier layer 143 formed in a trench 148, and a metal conductive layer 145 filled up the trench 148, wherein the metal conductive layer 145 may include low-resistant metals such as W, Al or Cu. The barrier layer 143 may also include a multi-composition structure with TiSi$_x$N$_y$. For example, the barrier layer 143 may include a plurality of first metal oxide layers such as SiN layers and a plurality of second metal oxide layers such as TiN layers stacked alternately on one over another, wherein indifferent deposition stage, at least plural first metal oxide layers directly in contact with each other or at least plural second metal oxide layers directly in contact with each other. Also, in the early stage of the deposition, a ratio between the quantities of the stacked TiN layers and the stacked SiN layers is about 2:1 to 4:3. However, in another embodiment, the ratio between the quantities of the stacked TiN layers and the stacked SiN layers in the early stage of the deposition may also reach to 0.5-1:20, but is not limited thereto. Then, the TiN layer cycles are gradually increased during the deposition process of the barrier layer 143. Thus, in the late stage of the deposition, a ratio between the quantities of the stacked TiN layers and the stacked SiN layers is about 5:1 to 10:1. Otherwise, in another embodiment, the ratio between the quantities of the stacked TiN layers and the stacked SiN layers in the late stage of the deposition may reach to 10-20:1.5-1, but is not limited thereto.

In other words, the barrier layer 143 of the present embodiment is formed through an ALD process to obtain the multi-composition structure of TiSi$_x$N$_y$, where in the early stage of the ALD process thereof, a bottom portion (namely the portion closed to the substrate 100) of the barrier layer 143 is formed to be silicon-rich, and a ratio of x:y in the bottom portion is about 10-20:0.1-1. In contrast, in the late stage of the ALD process thereof, a top portion (namely the portion closed to metal conductive layer 145) of the barrier layer 143 is formed to be nitrogen-rich, and a ratio of x:y in the top portion is about 0.1-1:10-20, but is not limited thereto. Furthermore, in another embodiment, a single-filmed barrier layer with continuously and gradually increased or decreased silicon or nitrogen may also be formed. The barrier layer also includes TiSi$_x$N$_y$ with x and y being greater than 0, and the ratio of x:y is varied by each portion of the barrier layer. Preferably, the ratio of x:y is varied from 20:0.1 to 0.1:20 from the bottom to the top, but is not limited thereto.

Through the aforementioned performances, the bottom portion of the multi-composition structure may serve as an ohmic contact layer thereto reduce the contact resistance between the storage node contact 140 and the substrate 100 underneath. On the other hand, the top portion (namely, the portion closed to the metal conductive layer 145) of the multi-composition structure is formed from a higher ratio of the stacked TiN layers, thereto obtain bigger crystal grain. In this way, the functions and the reliability of the storage node contact 140 may be sufficiently improved. Furthermore, since the multi-composition barrier layer 143 of the present invention consists of single material and is formed only through the ALD process, the additional stacked layers with different material have been omitted. That is, the height of the storage node contact is able to be reduced accordingly, and the fabrication of the barrier layer in the present invention may be easily achieved through a simplified and convenient process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM) device, comprising:
   a plurality of word lines, disposed in a substrate along a first trench extending along a first direction, each of the word lines comprising a multi-composition barrier layer, wherein the multi-composition barrier layer comprises $TiSi_xN_y$ with x and y being greater than 0, and the multi-composition barrier layer is silicon-rich at a bottom portion thereof and is nitrogen-rich at a top portion thereof, wherein x gradually decreases from 20 to 0.1 from the bottom to the top of the multi-composition barrier layer, and y gradually increases from 0.1 to 20 from the bottom to the top of the multi-composition barrier layer; and a plurality of bit lines disposed over the word lines and extending along a second direction across the first direction.

2. The DRAM device according to claim 1, wherein in the bottom portion of the multi-composition barrier layer, a ratio of x:y is about 10-20:0.1.

3. The DRAM device according to claim 1, wherein in the top portion of the multi-composition barrier layer, a ratio of x:y is about 0.1:10-20.

4. The DRAM device according to claim 1, wherein the multi-composition barrier layer comprises a plurality of SiN layers and a plurality of TiN layers stacked alternately.

5. The DRAM device according to claim 4, wherein in the bottom portion of the multi-composition barrier layer, a ratio between quantities of the TiN layers and the SiN layers is about 2:1 to 4:3.

6. The DRAM device according to claim 4, wherein in the top portion of the multi-composition barrier layer, a ratio between quantities of the TiN layers and the SiN layers is about 5:1 to 10:1.

7. The DRAM device according to claim 1, wherein each of the word lines further comprises a conductive layer disposed on the multi-composition barrier layer.

8. The DRAM device according to claim 1, wherein each of the bit lines comprises another conductive layer and a polysilicon layer.

9. The DRAM device according to claim 8, further comprising:
at least one contact disposed below the bit lines and the word lines.

10. The DRAM device according to claim 9, wherein the contact and the polysilicon layer are monolithic.

11. The DRAM device according to claim 1, further comprising:
at least one storage node contact, disposed at two sides of the word lines on the substrate.

12. The DRAM device according to claim 11, wherein the storage node contact comprises another multi-composition barrier layer, wherein the multi-composition barrier layer comprises $TiSi_xN_y$ with x and y being greater than 0, and the multi-composition barrier layer is silicon-rich at a bottom portion thereof and is nitrogen-rich at a top portion thereof.

13. The DRAM device according to claim 12, wherein in the bottom portion of the multi-composition barrier layer, a ratio of x:y is about 10-20:0.1; and in the top portion of the another multi-composition barrier layer, a ratio of x:y is about 0.1:10-20.

14. The DRAM device according to claim 12, wherein the another multi-composition barrier layer comprises a plurality of SiN layers and a plurality of TiN layers stacked alternately.

15. The DRAM device according to claim 14, wherein in the bottom portion of the multi-composition barrier layer, a ratio between quantities of the TiN layers and the SiN layers is about 2:1 to 4:3; and in the top portion of the multi-composition barrier layer, a ratio between quantities of the TiN layers and the SiN layers is about 5:1 to 10:1.

* * * * *